United States Patent
Koutny, Jr.

(10) Patent No.: US 7,329,934 B1
(45) Date of Patent: Feb. 12, 2008

(54) SMOOTH METAL SEMICONDUCTOR SURFACE AND METHOD FOR MAKING THE SAME

(75) Inventor: William W. C. Koutny, Jr., Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 195 days.

(21) Appl. No.: 10/850,247

(22) Filed: May 20, 2004

Related U.S. Application Data

(62) Division of application No. 10/113,309, filed on Mar. 29, 2002, now Pat. No. 6,740,588.

(51) Int. Cl.
*H01L 21/82* (2006.01)

(52) U.S. Cl. .................. 257/421; 257/295; 257/739

(58) Field of Classification Search .............. 257/421, 257/422, 295, 739, 750, 763, 764; 438/3
See application file for complete search history.

(56) References Cited

U.S. PATENT DOCUMENTS

| | | | | |
|---|---|---|---|---|
| 5,451,551 | A | | 9/1995 | Krishnan et al. ............ 438/626 |
| 5,925,225 | A | * | 7/1999 | Ngan et al. ............. 204/192.17 |
| 6,057,212 | A | * | 5/2000 | Chan et al. ................. 438/455 |
| 6,114,719 | A | * | 9/2000 | Dill et al. ................... 257/295 |
| 6,165,803 | A | * | 12/2000 | Chen et al. ..................... 438/3 |
| 6,329,305 | B1 | * | 12/2001 | Bower et al. ................ 438/800 |
| 6,482,657 | B2 | * | 11/2002 | Shimazawa ..................... 438/3 |
| 6,518,588 | B1 | * | 2/2003 | Parkin et al. .................... 257/3 |
| 6,548,389 | B2 | * | 4/2003 | Moriwaki et al. ........... 438/592 |
| 6,555,477 | B1 | | 4/2003 | Lu et al. ..................... 438/692 |
| 6,635,965 | B1 | * | 10/2003 | Lee et al. .................... 257/758 |
| 6,689,661 | B2 | * | 2/2004 | Durcan et al. .............. 438/268 |
| 6,720,572 | B1 | * | 4/2004 | Jackson et al. ................ 257/40 |
| 6,803,615 | B1 | * | 10/2004 | Sin et al. ..................... 257/295 |
| 6,884,466 | B2 | * | 4/2005 | Kaloyeros et al. ..... 427/255.392 |
| 2003/0021908 | A1 | * | 1/2003 | Nickel et al. ................ 427/551 |

FOREIGN PATENT DOCUMENTS

DE        10043159 A1  *  3/2002

\* cited by examiner

*Primary Examiner*—Kevin M. Picardat
(74) *Attorney, Agent, or Firm*—Kevin L. Daffer; Mollie E. Lettang; Daffer McDaniel, LLP

(57) ABSTRACT

A method for reducing the surface roughness of a metal layer is provided. In some embodiments, the method may include polishing the metal layer to a level substantially above any layers arranged directly beneath the metal layer. In some cases, the semiconductor topography comprising the metal layer may be substantially absent of any material laterally adjacent to the metal layer during polishing. In either case, a semiconductor topography having a metal layer with a mean surface roughness less than the mean surface roughness obtained during the deposition of the metal layer may be obtained. As such, the method may include reducing the mean surface roughness of a metal layer. For example, the method may include reducing the mean surface roughness of a metal layer by at least a factor of ten.

18 Claims, 6 Drawing Sheets

SMOOTH METAL SEMICONDUCTOR SURFACE AND METHOD FOR MAKING THE SAME

This application is a divisional application from prior application Ser. No. 10/113,309 filed Mar. 29, 2002, now U.S. Pat. No. 6,740,588.

BACKGROUND OF THE INVENTION

1. Field of the Invention

This invention relates to semiconductor device manufacturing, and more particularly, to a method for fabricating a metal layer with a substantially smooth surface.

2. Description of the Related Art

The following descriptions and examples are not admitted to be prior art by virtue of their inclusion within this section.

In most cases, a material may include a plurality of peaks and valleys upon its surface, which are associated with the surface roughness of the material. Such peaks and valleys may be visible by the naked eye or through an optical microscope, an electron microscope, or an atomic force microscope (AFM). In either embodiment, the surface roughness of a material may be characterized by the vertical distances between the bases of valleys and crests of their adjacent peaks. Since the dimensions of peaks and valleys may differ across a surface, calculating a statistical mean of a plurality of surface roughness measurements may yield a roughness that is more representative of the entire surface. For example, in some embodiments, an average of a plurality of surface roughness measurements may be calculated to produce a statistical mean of a material. In other embodiments, a root mean square of a plurality of surface roughness measurements may be calculated to produce a statistical mean of the material. In general, "root mean square" may be referred to as a measure of the magnitude of a set of numbers or measurements.

In some cases, the surface roughness of one or more layers within a semiconductor topography may affect the operation of a device formed from such a topography. For example, in cases including magnetic random access memory (MRAM) devices, layers with relatively rough surfaces may undesirably cause a junction within a device to breakdown at a relatively low voltage. In particular, relatively rough surfaces of layers within MRAM devices including magnetic tunneling junctions (MTJ) may cause a breakdown of the junction at a low voltage. In some cases, breakdown at a relatively low voltage may cause the device to frequently malfunction, thereby decreasing the reliability and/or yield of the device. In addition or alternatively, the threshold voltage by which the device is activated may be lower and thus, the junction breakdown may inhibit the entire operation of the device in some cases. In general, the breakdown of a MTJ may be attributed to an uneven tunneling layer within the junction. Since tunneling layers within MTJs are typically very thin (e.g., approximately 15 angstroms or less), the unevenness of such a layer may be caused by relatively rough surfaces of underlying layers. Consequently, it may be beneficial to deposit a layer with substantially smooth surfaces under such a tunneling layer.

Conventional deposition processes, however, have limited capability to produce layers with substantially smooth surfaces. In particular, deposition techniques used in the semiconductor fabrication industry typically produce layers with relatively rough topographies. For example, conventional deposition techniques may yield a root mean square surface roughness that is greater than approximately 100 angstroms and in some cases, greater than approximately several thousand angstroms. "Root mean square" may refer to a result of a statistical calculation correlating a plurality of measurements as described above. Moreover, the accumulation of layers with such surface roughnesses may cause an upper layer to have an even greater surface roughness than may be produced by a particular deposition technique.

Therefore, it would be desirable to develop a method for fabricating semiconductor layers with substantially smooth surfaces. In particular, it may be advantageous to develop an MRAM device, which includes substantially smooth layers underlying a tunneling layer. Consequently, a method for reducing the likelihood of junction breakdown within a MRAM device may be developed.

SUMMARY OF THE INVENTION

The problems outlined above may be in large part addressed by a method for reducing the surface roughness of a metal layer. In particular, a method is provided for reducing the mean surface roughness of a metal layer. In some embodiments, the method may include polishing the metal layer to a level substantially above any layers arranged directly beneath the metal layer. In some cases, the semiconductor topography comprising the metal layer may be substantially absent of any material laterally adjacent to the metal layer during polishing. In either case, a semiconductor topography having a metal layer with a mean surface roughness less than the mean surface roughness obtained during the deposition of the metal layer may be obtained. For example, a metal structure with a mean surface roughness less than approximately 10 angstroms may be obtained.

In yet other embodiments, the method may include depositing a fill layer upon a metal layer and subsequently polishing the fill layer. In some cases, polishing the fill layer may form a surface which includes portions of the metal layer and portions of the fill layer residing above the metal layer. In this manner, a semiconductor layer may be formed with fill material arranged around and within a plurality of peaks and valleys associated with the surface roughness of the metal layer. In such an embodiment, an upper surface of the fill layer may be substantially level with at least one of the peaks. In other cases, polishing the fill layer may include forming a surface in which the fill layer is arranged above an upper boundary of the metal layer-fill layer interface. In such an embodiment, the thickness of the fill layer arranged above the upper boundary may be less than the thickness of the interface.

As stated above, some embodiments of the method described herein may include polishing a metal layer arranged across approximately an entirety of a semiconductor topography to a level substantially above any layers arranged directly beneath the metal layer. In particular, the method may include depositing a metal layer upon a semiconductor topography, polishing the metal layer, and terminating the polishing process at a level substantially above any layers arranged directly beneath the metal layer. In some cases, the semiconductor topography comprising the metal layer may be substantially absent of any material arranged laterally adjacent to the metal layer during the polishing process.

In either embodiment, the polishing process may include removing an upper portion of the metal layer such that no underlying layer is exposed. In some cases, polishing the metal layer may include removing between approximately 100 angstroms and approximately several thousand angstroms of the metal layer. In other embodiments, polishing the metal layer may include removing less than approximately 100 angstroms. In addition, in some cases the method may include patterning the metal layer. For example, in some embodiments, the method may include patterning the metal layer prior to the polishing process. In other embodiments, the method may include patterning the metal layer subsequent to the polishing process. In such an embodiment, the method may further include depositing a layer upon the polished metal layer prior to the patterning process. In general, the metal layer may include any metallic material, such as, but not limited to, aluminum, copper, tantalum, tungsten, titanium, or a metal alloy thereof. In addition or alternatively, the metal layer may include a metal nitride material, such as, but not limited to, titanium nitride or tungsten nitride.

In some embodiments, the method may include measuring a mean surface roughness of the metal layer subsequent to polishing the metal layer. In particular, measuring the mean surface roughness may include calculating an average surface roughness, a root mean square surface roughness, or any other statistical mean surface roughness of the metal layer. In some cases, the method may further include re-polishing the metal layer when the measured mean surface roughness is above a predetermined value. In this manner, a lower mean surface roughness may be obtained. In either case, polishing the metal layer may include reducing the mean surface roughness of the metal layer. For example, in some embodiments, polishing the metal layer may include reducing the mean surface roughness of the metal layer by a factor of at least approximately ten. More particularly, polishing the metal layer may include reducing the mean surface roughness of the metal layer by a factor between approximately ten and one hundred. In yet other embodiments, polishing the metal layer may include reducing the mean surface roughness of the metal layer by a factor of approximately fifty. In either embodiment, reducing the mean surface roughness may include reducing an average surface roughness, a root mean square surface roughness, or any other statistical mean surface roughness of the metal layer.

Consequently, polishing the metal layer may include producing a mean surface roughness less than the mean surface roughness obtained during the deposition of the metal layer. For example, in some embodiments, polishing the metal layer may include producing a mean surface roughness of less than approximately 80 angstroms. In other embodiments, polishing the metal layer may include producing a mean surface roughness of less than approximately 10 angstroms. In yet other embodiments, polishing the metal layer may include producing a mean surface roughness between approximately 2 angstroms and approximately 3 angstroms.

Accordingly, a semiconductor topography having a metal layer with a mean surface roughness less than the mean surface roughness obtained during the deposition of the metal layer may be obtained. For example, a semiconductor topography with a metal layer having a mean surface roughness of less than approximately 80 angstroms may be obtained. In some embodiments, the metal layer may include a mean surface roughness of less than approximately 10 angstroms. More specifically, in some embodiments the metal layer may include a mean surface roughness between approximately 2 angstroms and approximately 3 angstroms. In some embodiments, the metal layer may be arranged within a magnetic random access memory (MRAM) device. In such an embodiment, the metal layer may include a digit line of the MRAM device. Alternatively, the metal layer may include a layer within a magnetic tunneling junction of the MRAM device. In yet another embodiment, the metal layer may be arranged within a semiconductor topography that does not include a MRAM device.

In another embodiment of the semiconductor topography described herein, a layer within a semiconductor topography may include a metal surface having a plurality of peaks and valleys associated with the roughness of the metal surface and a fill material arranged within the valleys. In some cases, the fill material may be arranged upon the metal surface such that an upper surface of the fill material is substantially level with at least one of the peaks. In some embodiments, the fill material may include a dielectric; while in other embodiments, the fill material may include a conductive material. As in the embodiments described above, the metal surface may include any metallic material, such as, but not limited to, aluminum, copper, tantalum, tungsten, titanium, or a metal alloy thereof. In addition or alternatively, the metal surface may include a metal nitride, such as, but not limited to, titanium nitride or tungsten nitride. In this manner, the semiconductor layer may include one or more other metal surfaces adapted for electrical connection with a conductive layer. For example, in some cases, the one or more other metal surfaces may include the lowermost surface of the semiconductor structure and/or one or more sidewalls of the semiconductor structure. In addition, the metal surface may be arranged within a MRAM device. In such an embodiment, the metal surface may include a digit line of the MRAM device. In yet other embodiments, the metal surface may include a layer within a magnetic tunneling junction of the MRAM device. Alternatively, the metal layer may be arranged within a semiconductor topography that does not include a MRAM device.

A method for processing a semiconductor topography with such a fill material may include, for example, depositing a fill layer upon a metal layer of the semiconductor topography and polishing the fill layer to form a surface. In some cases, the surface may include portions of the metal layer and portions of the fill layer residing above the metal layer. In such an embodiment, polishing may include removing less than approximately 100 angstroms of the metal layer. In other embodiments, the surface may include the fill layer arranged above an upper boundary of the metal layer-fill layer interface. In general, the interface may include laterally adjacent portions of a metal layer and a fill layer. The upper boundary of such an interface may be denoted by the upper most portion of the metal layer and laterally adjacent portions of the fill layer, while the lower boundary of the interface may be denoted by the lower most portion of the fill layer and laterally adjacent portions of the metal layer. In such an embodiment, in some cases the thickness of the fill layer arranged above the upper boundary may be less than the thickness of the interface. For example, in some embodiments the thickness of the interface may be at least approximately 70 angstroms and the thickness of the fill layer above the interface may be less than approximately 40 angstroms. However, larger or smaller thicknesses of the interface and fill layer above the interface may be appropriate depending on the design specifications of the device.

In either case, polishing the fill layer may include producing a mean surface roughness that is at least approximately 10 times less than a mean surface roughness of the metal layer prior to depositing the fill layer. In this manner, depositing and polishing the fill layer may include producing a mean surface roughness of less than approximately 10 angstroms, for example. In yet other embodiments, the method may include producing a mean surface roughness of less than approximately 4 angstroms, or more specifically between approximately 2 angstroms and approximately 4 angstroms. In some embodiments, the method may include measuring a mean surface roughness of the surface subsequent to polishing. In particular, measuring the mean surface roughness may include calculating an average surface roughness, a root mean square surface roughness, or any other statistical mean surface roughness of the metal layer. In cases when the measured mean surface roughness is above a predetermined value, the method may include re-polishing the surface. In this manner, a lower mean surface roughness may be obtained. In addition or alternatively, the method may include patterning the metal layer. In some cases, the patterning process may be conducted prior to polishing the fill layer. In other cases, the patterning process may be conducted subsequent to polishing the fill layer.

There may be several advantages for reducing the mean surface roughness of a metal layer as described herein. For example, metal layers with substantially smooth surfaces may allow a junction within a MRAM device formed therefrom to breakdown at a higher voltage than in an embodiment in which the junction is formed from layers with relatively rough surfaces. In particular, a MRAM device with substantially smooth layers below a tunneling layer of a magnetic tunneling junction (MTJ) may allow a substantially even and smooth tunneling layer to be formed, thereby preventing the junction from breakdown at a lower voltage. Consequently, the process window at which a MRAM device may be operated may be made larger by the inclusion of substantially smooth surfaces. As a result, the device may be operated at a lower current and consume less power. In addition or alternatively, the reliability and endurance of a device may be increased by the inclusion of smooth surfaces within the device. Furthermore, producing a substantially smooth metal layer may aid in producing substantially smooth layers above the metal layer, since the overlying layers will not conform to a relatively rough surface. Moreover, in the embodiment in which a fill layer is used to fill the valleys of the metal layer associated with the surface roughness of the metal layer, the method may reduce or eliminate the removal of the metal layer. In such an embodiment, the metal layer may be deposited within the design specifications of the device.

BRIEF DESCRIPTION OF THE DRAWINGS

Other objects and advantages of the invention will become apparent upon reading the following detailed description and upon reference to the accompanying drawings in which:

FIG. 9 depicts a partial cross-sectional view of the semiconductor topography subsequent to patterning the fill layer and metal layer of FIG. 8a;

Figure 1:
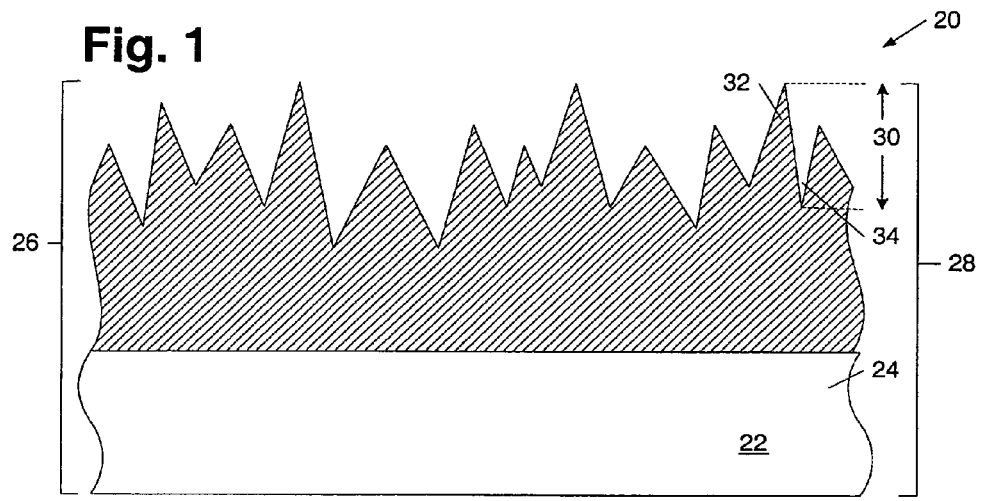
FIG. 1 depicts a partial cross-sectional view of a semiconductor topography including a metal layer with a plurality of peaks and valleys associated with the surface roughness of the layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of methods for processing a semiconductor topography are shown in FIGS. 1-11. In particular, methods for reducing the mean surface roughness of a metal layer are provided. FIG. 1 depicts a partial cross-sectional view of semiconductor topography 20 in which metal layer 24 is arranged upon semiconductor layer 22. The upper portion of metal layer 24 is shown with a plurality of peaks and valleys representing the surface roughness of the layer. It is noted that the peaks and valleys are greatly exaggerated with respect to the thickness of the layer to emphasize the roughness of the layer prior to the application of the smoothening process described herein. In general, the mean surface roughness of metal layer 24 may be on the order of one hundred or a few hundred angstroms while the thickness of metal layer 24 may be between a few hundred angstroms and a few thousand angstroms. The measurement of the surface roughness of a layer is described in more detail below, but may be generally characterized by the vertical distance between a peak crest and an adjacent valley base. In addition, lateral surfaces 26 and 28 of semiconductor topography 20 are drawn to indicate the continuation of semiconductor topography 20 to the left and right, respectively. In other embodiments, lateral surfaces 26 and 28 may represent the edges of a wafer upon which semiconductor topography 20 is formed. Consequently, the cross-sectional views of FIGS. 1-11 may be representative of metal layer 24 formed across an entirety of a wafer or a portion of a wafer.

In some embodiments, semiconductor layer 22 may be a semiconductor substrate such as a silicon substrate, and may be doped either n-type or p-type. More specifically, semiconductor layer 22 may be a monocrystalline silicon substrate, a silicon-germanium substrate or a silicon on insulator (SOI) layer formed upon a monocrystalline substrate. Alternatively, semiconductor layer 22 may include structures and layers formed upon a semiconductor substrate. The structures and layers may include, but are not limited to, dielectric layers, metallization layers, gate structures, contact structures, vias, or local interconnect wires. In this manner, semiconductor layer 22 may be substantially planar or may have substantial elevational differences due to the formation of such structures and layers. In such an embodiment, metal layer 24 may either be substantially planar or may have substantial elevation differences, depending on the deposition characteristics, thickness, and composition of the metal layer. For example, metal layer 24 may be deposited non-conformally such that the elevationally recessed regions of semiconductor layer 22 are filled to be coplanar with the portions of metal layer 24 residing above the elevationally raised regions of semiconductor layer 22. In other embodiments, metal layer 24 may be deposited conformally such that the metal layer mimics the elevational profile of the underlying semiconductor layer. In either embodiment, the upper surface of semiconductor layer 22 may include an interlevel dielectric layer to insulate underlying structures and/or layers. In addition or alternatively, semiconductor layer 22 may include isolation regions and/or diffusion regions (not shown).

Metal layer 24 may include a metallic layer, such as, but not limited to, aluminum, copper, tantalum, titanium, tungsten, or a metal alloy thereof. In addition or alternatively, the metal layer may include a metal nitride material, such as, but not limited to, titanium nitride or tungsten nitride. Moreover, metal layer 24 may have a thickness, for example, between approximately 300 angstroms to approximately 3000 angstroms. Larger and smaller thicknesses of metal layer 24, however, may be used depending on the specifications of the device. In some embodiments, an additional layer may be interposed between metal layer 24 and semiconductor layer 22. For example, a dielectric layer such as, a gate dielectric or interlevel dielectric, may be interposed between metal layer 24 and semiconductor layer 22. In other embodiments, an etch stop layer may be interposed between metal layer 24 and semiconductor layer 22 for the subsequent patterning of metal layer 24. In general, metal layer 24 may be used to form a process structure of a subsequently formed device. For example, such a structure may be a gate conductor or an interconnect line. In some embodiments, the structure may include a metal layer of a magnetic random access memory (MRAM) device. For example, the structure may include a digit line of a MRAM device. Alternatively, the structure may include a layer within a magnetic tunneling junction (MTJ) of a MRAM device.

The method described herein may be used to form such a structure with a substantially smooth surface. In some embodiments, forming a substantially smooth layer underneath the tunneling layer of a MTJ may advantageously enhance the performance of the device. In particular, forming a substantially smooth layer underneath the tunneling layer of a MTJ may allow a junction within a MRAM device formed therefrom to breakdown at a higher voltage than in an embodiment in which the junction is formed from layers with relatively rough surfaces. In particular, a MRAM device with substantially smooth layers below a tunneling layer of a magnetic tunneling junction (MTJ) may allow a substantially even and smooth tunneling layer to be formed, thereby preventing the junction from breakdown at a lower voltage. Consequently, the process window at which a MRAM device may be operated may be made larger by the inclusion of substantially smooth surfaces. As a result, the device may be operated at a lower current and consume less power. In addition or alternatively, the reliability and endurance of a device may be increased by the inclusion of smooth surfaces within the device. Furthermore, producing a substantially smooth metal layer may aid in producing substantially smooth layers above the metal layer, since the overlying layers will not have to conform to a relatively rough surface.

In general, metal layer 24 may be formed upon semiconductor layer 22 using a variety of deposition techniques used in the semiconductor fabrication industry. For example, metal layer 24 may be deposited upon semiconductor layer 22 by chemical vapor deposition (CVD), physical vapor deposition (PVD), sputtering, or plating techniques. As described above, the deposition of metal layer 24 may be conformal or non-conformal, depending on the deposition method and the thickness and composition of metal layer 24. Likewise, the surface roughness of metal layer 24 may depend upon the deposition method and the composition of metal layer 24. Regardless of the deposition and material parameters, however, the deposition techniques used to deposit metal layer 24 may produce a relatively rough surface. In particular, the deposition of metal layer 24 may generate a root mean square surface roughness between approximately 100 angstroms and approximately 300 angstroms, regardless of the deposition technique used to deposit metal layer 24.

As stated above, the surface roughness of metal layer 24 may be illustrated by peaks and valleys within its upper surface as shown in FIG. 1. However, such peaks and valleys may be distinct from elevationally recessed and raised regions associated with the planarity of metal layer 24. In general, the widths of peaks and/or valleys associated with the surface roughness of metal layer 24 may be on the order of tens of angstroms. Conversely, the widths of elevationally recessed and raised regions associated with the planarity of metal layer 24 may be between approximately a few hundred and several thousand angstroms. In this manner, a substantially nonplanar surface may include a relatively rough or smooth surface and vice versa. Another manner in which to explain the differences between the topographies of a relatively rough surface and a substantially nonplanar surface is to describe the cross-sectional profile of each surface. For example, the cross-profile of a relatively rough surface may include a plurality of "mounds" spaced relatively close to each other. The "mounds" may appear similar to a plurality of mountains or large hills along a horizon. Conversely, the cross-profile of a substantially non-planar surface may include a wave-like topography or a plurality of stepped regions spaced relatively far apart from each other.

As stated above, the surface roughness of a layer may be characterized by the vertical distances between valley bases and adjacent peak crests. For example, distance 30 between the crest of peak 32 and the base of valley 34 may be a measurement of the surface roughness of metal layer 24. However, since the dimensions of the peaks and valleys may differ across metal layer 24, calculating a statistical mean of a plurality of surface roughness measurements may yield a roughness that is more representative of the entire surface. For example, in some embodiments, an average of a plurality of surface roughness measurements may be calculated to produce a statistical mean of a material. Such a calculation may be referred to as the "average surface roughness" or "$R_a$." In other embodiments, a root mean square of a plurality of surface roughness measurements may be calculated to produce a statistical mean of the material. Such a calculation may be referred to as the "root mean square surface roughness" or "$R_{rms}$." In general, "root mean square" may refer to an average measure of the magnitude of a set of numbers or measurements.

Figure 2:
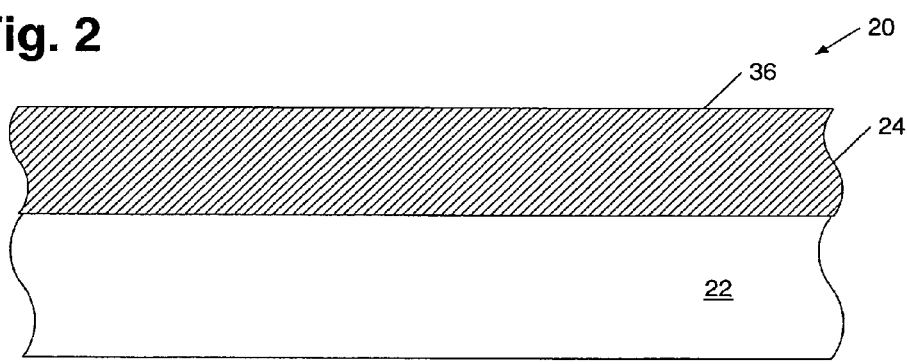
FIG. 2 depicts a partial cross-sectional view of the semiconductor topography subsequent to polishing the metal layer of FIG. 1.

In an embodiment, metal layer 24 may be polished to form substantially smooth surface 36 as shown in FIG. 2. In particular, such a polishing process may include removing an upper portion of metal layer 24 such that substantially smooth surface 36 is obtained. In some cases, polishing metal layer 24 may include removing between approximately 100 angstroms and approximately several thousand angstroms of the layer. In other embodiments, polishing metal layer 24 may include removing less than approximately 100 angstroms. Larger or smaller amounts of metal layer 24, however, may be removed depending on the process parameters of the polishing process. In addition, the polishing process may include removing an upper portion of metal layer 24 such that no underlying layer is exposed. As such, the polishing process may be terminated at a level substantially above semiconductor layer 22, as shown in FIG. 2. In addition, the polishing process may be terminated at a level above other layers, which are not shown in FIG. 2 but may be included in portions of semiconductor topography extending from lateral surfaces 26 and/or 28. Such other layers may include other underlying layers and/or layers arranged lateral to metal layer 24. In other embodiments, semiconductor topography 20 may be substantially absent of any material laterally adjacent to metal layer 24 during the polishing process.

The polishing process may involve pressing semiconductor topography 20 down toward a polishing pad such that metal layer 24 is facing the polishing pad. During the polishing process, the polishing pad and/or semiconductor topography 20 may be set in motion while metal layer 24 is forced against the polishing pad. For example, the polishing pad and semiconductor topography 20 may each be placed on a rotatable table. Alternatively, semiconductor topography 20 may be rotated relative to a fixed pad or vice versa. In another embodiment, the polishing pad may be a belt, which traverses against a fixed or rotating semiconductor topography. In either case, the polishing pad may be made of various materials, depending on the polishing characteristics of metal layer 24 and the process parameters of the polishing process. For example, the polishing pad may include a medium such as polyurethane or polyurethane-impregnated polyester felts. In addition, the polishing pad, in some embodiments, may include abrasive particles imbedded within the pad. In other embodiments, the polishing pad may be substantially absent of abrasive particles.

In some cases, an abrasive, fluid-based chemical may be deposited upon the surface of the polishing pad during the polishing process. In particular, the chemical may be deposited in a manner to occupy an interface between the polishing pad and the surface of metal layer 24. As such, semiconductor topography 20 may be positioned such that the peaks associated with the surface roughness of metal layer 24 may be in contact with the chemical solution. The solution may initiate the polishing process by chemically reacting with the metal layer 24. The movement of the polishing pad and/or semiconductor topography 20 may cause abrasive particles entrained within the solution to physically strip the reacted surface material of metal layer 24. Such abrasive solution particles may include, for example, silica, alumina, or ceria. Alternatively, a polishing solution substantially absent of abrasive particles may be used. Such an embodiment may be particularly advantageous when the polishing pad includes abrasive particles imbedded therein.

In addition or alternatively, the polishing solution may be substantially absent of abrasive chemicals, such as strong acids or bases. Some factors that may influence the effect of any solution used during the polishing process may include the pH of the solution, the flow dynamics at the pad and semiconductor topography interface, and the etch selectivity of the solution with respect to metal layer 24. In yet other embodiments, the polishing process may be substantially absent of a solution applied at the interface of metal layer 24 and the polishing pad. In any case, a post-polishing cleaning step may be desirable to remove residual polishing particles from the surface of metal layer 24 in some embodiments. In other cases, the solution applied during the polishing process may be sufficient to remove such residual particles.

In any embodiment, the polishing process may advantageously reduce the mean surface roughness of metal layer 24. In particular, the polishing process may reduce the mean surface roughness of metal layer 24 by a factor of at least approximately ten. More particularly, polishing metal layer 24 may include reducing the mean surface roughness of the layer by a factor between approximately ten and one hundred. In yet other embodiments, the polishing process may reduce the mean surface roughness of the metal layer by a factor of approximately fifty. In either embodiment, reducing the mean surface roughness may include reducing an average surface roughness, a root mean square surface roughness, or any other statistical mean surface roughness of the metal layer.

Consequently, polishing the metal layer may include producing a mean surface roughness less than the mean surface roughness obtained during the deposition of the metal layer. For example, in some embodiments, polishing the metal layer may include producing a mean surface roughness of less than approximately 80 angstroms. In other embodiments, polishing the metal layer may include producing a mean surface roughness of less than approximately 10 angstroms or less than approximately 2 angstroms. In yet other embodiments, polishing the metal layer may include producing a mean surface roughness between approximately 2 angstroms and approximately 3 angstroms. As stated above, such mean surface roughness values may be obtained using any statistical mean calculation, such as average or root mean square. Although FIG. 2 shows substantially smooth surface 36 absent of any peaks or valleys, in some embodiments, smooth surface 36 may include peaks and valleys. However, the peaks and valleys of smooth surface 36, in such an embodiment, may be small enough to produce mean surface roughness values as referenced above.

In some cases, the method may include measuring a mean surface roughness of metal layer 24 subsequent to polishing the metal layer. In particular, measuring the mean surface roughness may include calculating an average surface roughness, a root mean square surface roughness, or any other statistical mean surface roughness of metal layer 24. In such an embodiment, the method may further include re-polishing metal layer 24 when the measured mean surface roughness is above a predetermined value. For example, in some cases, a predetermined value may be a mean surface roughness greater than approximately ten angstroms. Larger and smaller mean surface roughness values may be used for the predetermined value, however, depending on the design specifications of the device. In other embodiments, metal layer 24 may be re-polished without measuring the mean surface roughness of the layer. In either embodiment, such a re-polishing step may allow a lower mean surface roughness to be obtained. More specifically, such a re-polishing step may produce a lower mean surface roughness than obtained during the first polishing step.

Figure 3:
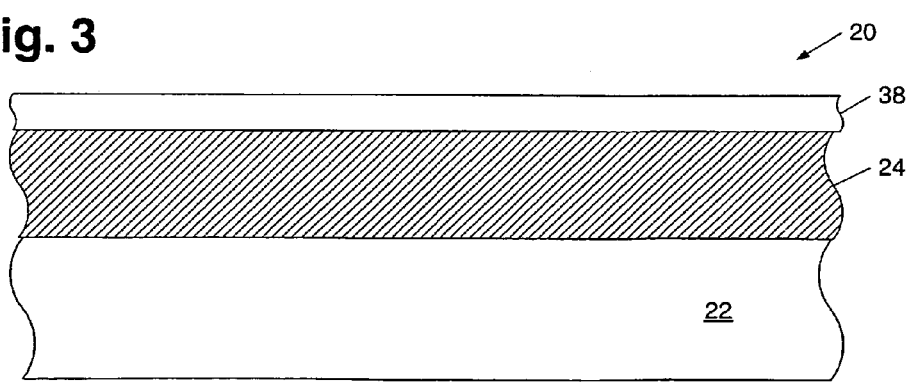
FIG. 3 depicts a partial cross-sectional view of the semiconductor topography subsequent to the deposition of an additional layer upon the polished metal layer of FIG. 2.

In some embodiments, upper layer 38 may be formed upon smooth surface 36 subsequent to the polishing process as illustrated in FIG. 3. Upper layer 38 may include a variety of materials and thicknesses, depending on the function it may serve as described below. In general, however, upper layer 38 may include a thickness between approximately 50 angstroms and approximately 2000 angstroms. Larger or smaller thicknesses of upper layer 38, however, may be appropriate depending on the semiconductor device being formed. In addition, upper layer 38 may include a dielectric material such as, for example, undoped polysilicon, silicon oxide, silicon nitride, silicon oxynitride, silicon dioxide/silicon nitride, or silicon dioxide/silicon nitride/silicon dioxide. In addition or alternatively, upper layer 38 may include a conductive material such as, doped polysilicon, aluminum, copper, tungsten, titanium, tungsten nitride, titanium nitride, tungsten silicide, cobalt silicide, titanium silicide, or nickel silicide. Other materials, however, may be used depending on the design specifications of the device. In an alternative embodiment, the formation of upper layer 38 may be omitted from the method described herein. In such an embodiment, the method may continue from FIG. 2 to FIG. 4.

As stated above, upper layer 38 may serve a variety of purposes. For example, in some embodiments, upper layer 38 may serve as a diffusion barrier layer such that impurities cannot be subsequently diffused from or into metal layer 24. In addition or alternatively, upper layer 38 may be used to decrease the resistance of metal layer 24. In yet other embodiments, upper layer 38 may be used to strap subsequently formed gate regions of opposite conductivity type together. In particular, upper layer 38 may provide a conductive path across a p-n junction formed when a connection is made to gates of opposite conductivity type. In other embodiments, upper layer 38 may serve to prevent contact to metal layer 24. For example, in an embodiment in which a gate structure is formed from metal layer 24, contact to the upper surface of the gate structure may be prevented, thereby preventing a short from occurring through the gate.

Additionally or alternatively, upper layer 38 may serve as an etch stop layer for a structure subsequently formed from metal layer 34. For example, in an embodiment in which a gate structure is formed from metal layer 24, upper layer 38 may serve as an etch stop layer during the formation of spacers along the sidewalls of the gate. In such an embodiment, upper layer 38 may protect the upper surface of the gate structure from the etch process used to form the spacers. In yet other embodiments, upper layer 38 may additionally or alternatively serve as a hardmask layer to protect underlying layers during the formation of a structure from metal layer 24. In any embodiment, upper layer 38 may advantageously protect the polished surface of metal layer 24 such that it may remain substantially smooth. For example, upper layer 38 may protect substantially smooth surface 36 during the removal of a resist layer used to pattern metal layer 24 as described in more detail below.

Figure 4:
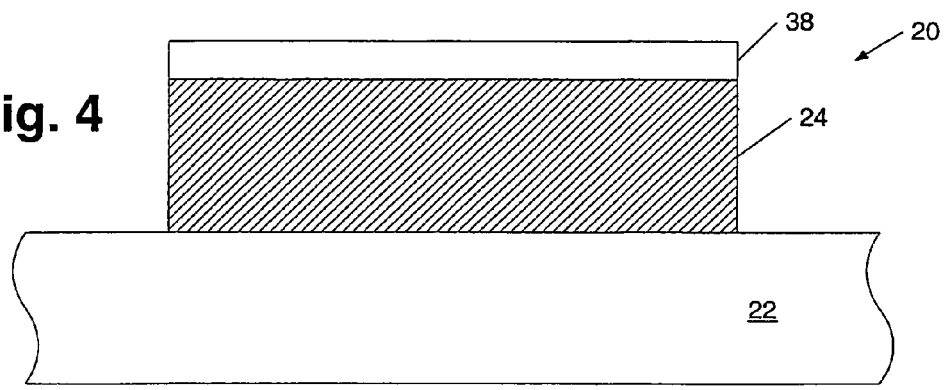
FIG. 4 depicts a partial cross-sectional view of the semiconductor topography in which the additional layer and metal layer are patterned subsequent to the deposition of the additional layer in FIG. 4.

FIG. 4 illustrates semiconductor topography 20 subsequent to the patterning of metal layer 24 and upper layer 38. Such a patterning process may be used to form a conductive structure such as a gate structure or an interconnect line, for example. In some embodiments, the structure may include a metal layer of a magnetic random access memory (MRAM) device. For example, the structure may include a digit line of a MRAM device. Alternatively, the structure may include a layer within a magnetic tunneling junction (MTJ) of a MRAM device. Although FIG. 4 shows the formation of a single structure, any number of structures may be patterned across semiconductor topography 20 in accordance with design specifications of the device. In addition, the structures may be formed with various dimensions and spacings therebetween in accordance with the design specifications of the device.

Such a patterning process may be conducted by photolithography and etch processes generally used in the semiconductor fabrication industry. In particular, a resist layer may be formed upon upper layer 38, the resist may be patterned to form a mask for the subsequently formed structure, and exposed portions of upper layer 38 and metal layer 24 may be removed. Subsequently, the resist layer may be removed by a stripping process such as a wet etch or a reactive ion etch stripping process. In some cases, the removal of such a resist layer may alter the surface roughness of an underlying metal layer and therefore, it may be advantageous to include a barrier layer such as upper layer 38 to protect the polished surface of metal layer 24. In this manner, the smoothness of subsequently formed overlying layers may not be affected. In such an embodiment, however, upper layer 38 may include a material by which the resist removal process does not alter the surface roughness of upper layer 38. In other embodiments, the removal of the resist layer may not alter the surface roughness of metal layer 24 and therefore, upper layer 38 may not be needed to protect metal layer 24 during the patterning process, but may be included for other purposes as described above. In yet other embodiments, upper layer 38 may be omitted from semiconductor topography 20 and metal layer 24, alone, may be patterned.

Figure 5:
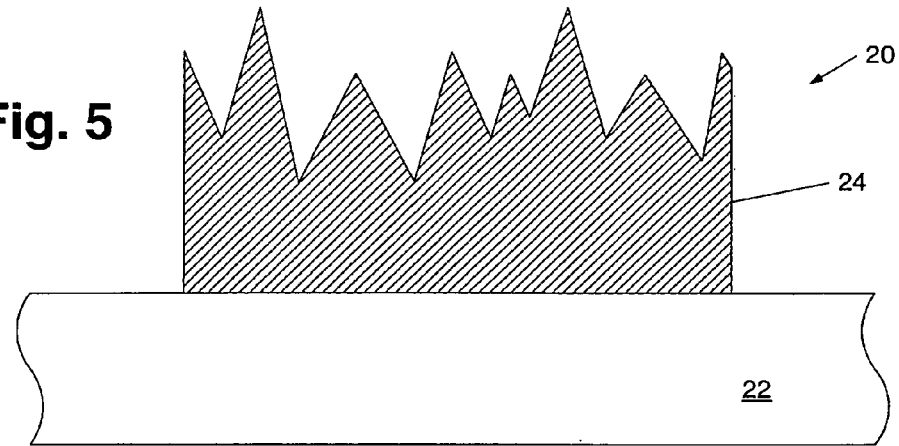
FIG. 5 depicts a partial cross-sectional view of the semiconductor topography, in an alternative embodiment, in which the metal layer of FIG. 1 is patterned.

In an alternative embodiment for the method described herein, the sequence of the polishing and patterning processes described above may be changed such that semiconductor topography 20 is patterned prior to the polishing process. In this manner, semiconductor topography 20 may be substantially absent of any material laterally adjacent to metal layer 24 during the polishing process. FIG. 5 illustrates metal layer 24 patterned subsequent to FIG. 1 and prior to the polishing process described in FIG. 2. Such a patterning process may be similar to the patterning process described in FIG. 4 above. As such, the patterning process may include forming a resist layer upon metal layer 24, patterning the resist layer to form a mask for the subsequently formed structure, removing exposed portions of metal layer 24, and removing remaining portions of the resist layer.

Figure 6:
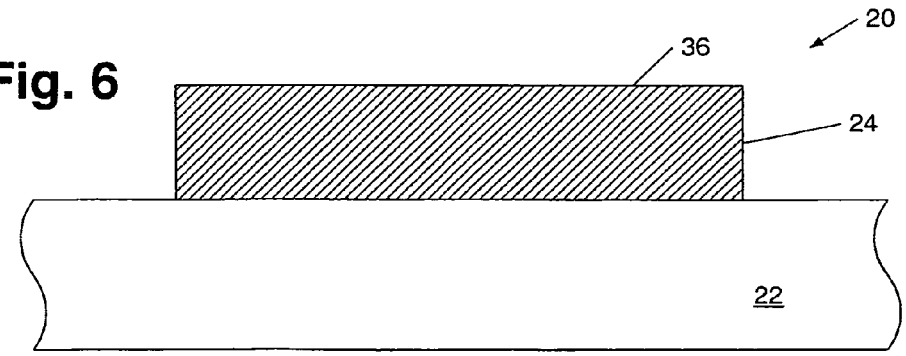
FIG. 6 depicts a partial cross-sectional view of the semiconductor topography subsequent to polishing the patterned metal layer of FIG. 5.

Although the removal of the resist layer during such a patterning process may, in some embodiments, increase or decrease the surface roughness of metal layer 24, such a patterning process may not render a substantially smooth surface (i.e., a surface with a mean surface roughness of less than approximately 80 angstroms) on metal layer 24. Therefore, metal layer 24 may be subsequently polished to form substantially smooth surface 36 as shown in FIG. 6. Such a polishing process may be similar to that of the polishing process described for FIG. 2. In this manner, the polishing process may include pressing semiconductor topography 20 toward a polishing pad such that an upper portion of metal layer 24 may be removed. In particular, the polishing process may include removing an upper portion of metal layer 24 such that no underlying layer is exposed. As shown in FIG. 4, such a polishing process may be terminated at a level substantially above semiconductor layer 22. In addition, the polishing process, in such an embodiment, may include producing a mean surface roughness less than the mean surface roughness obtained during the deposition of the metal layer and/or subsequent to the patterning process described above. Such a reduction in mean surface roughness may be quantified by similar factors or roughness ranges as described in FIG. 2 above.

In addition, although FIG. 6 shows substantially smooth surface 36 absent of any peaks or valleys, in some embodiments, smooth surface 36 may include peaks and valleys. However, the peaks and valleys of smooth surface 36, in such an embodiment, may be small enough to produce mean surface roughness values as referenced in FIG. 2 above. In addition and as included in the method of FIGS. 1-4, a mean surface roughness of metal layer 24 may be determined subsequent to polishing metal layer 24. In some cases, the method may further include re-polishing metal layer 24 when the measured mean surface roughness is above a predetermined value. For example, in some cases, the predetermined value may be a mean surface roughness greater than approximately ten angstroms. Larger and smaller mean surface roughness values may be used for the predetermined value, however, depending on the design specifications of the device. In other embodiments, metal layer 24 may be re-polished without measuring the mean surface roughness of the layer. In either embodiment, such a re-polishing step may allow a lower mean surface roughness to be obtained. More specifically, such a re-polishing step may produce a lower mean surface roughness than obtained during the first polishing step.

Figure 7:
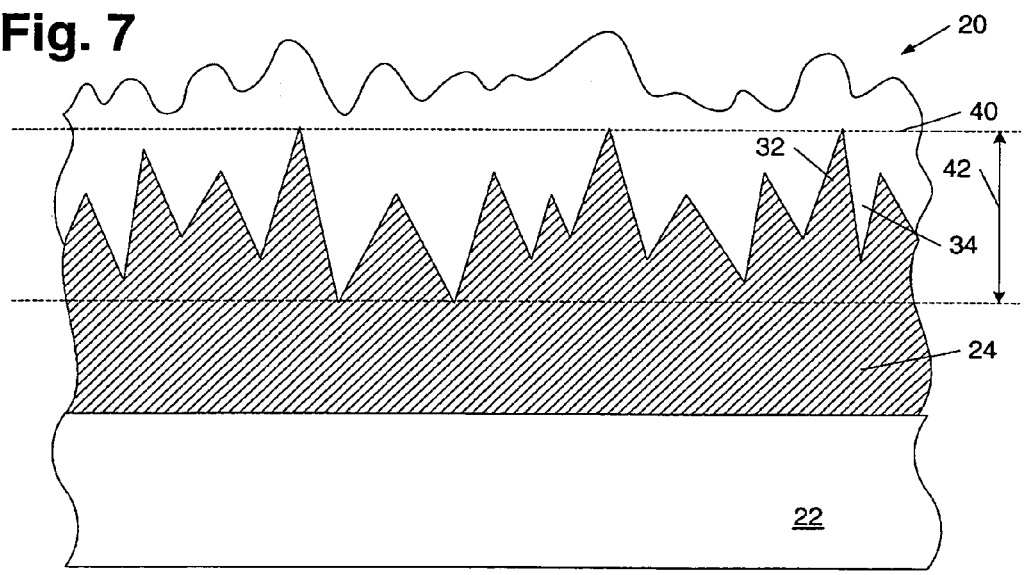
FIG. 7 depicts a partial cross-sectional view of the semiconductor topography, in an alternative embodiment, in which a fill layer is deposited upon the metal layer of FIG. 1.
Figure 8A:
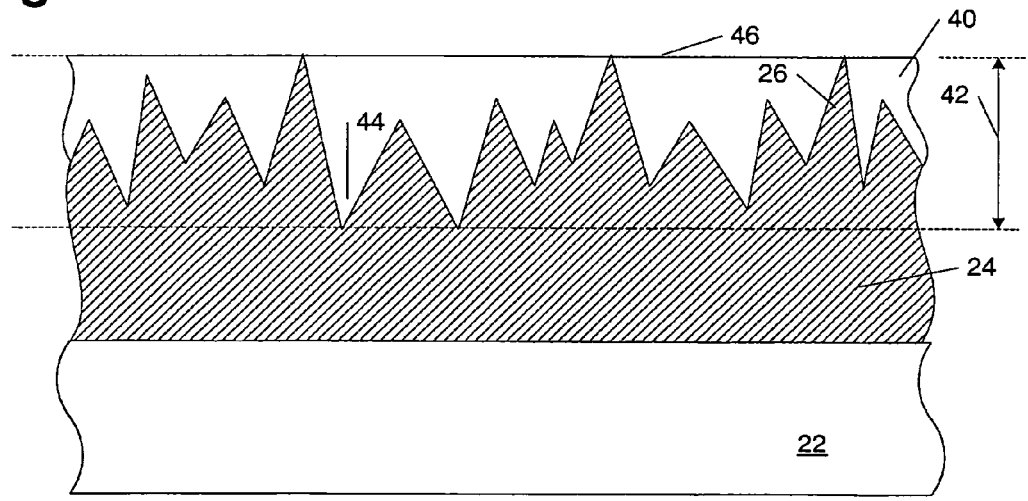
FIG. 8a depicts a partial cross-sectional view of the semiconductor topography in which the fill layer of FIG. 7 is polished such that an upper surface of the fill layer is substantially level with at least one peak associated with the surface roughness of the metal layer.
Figure 8B:
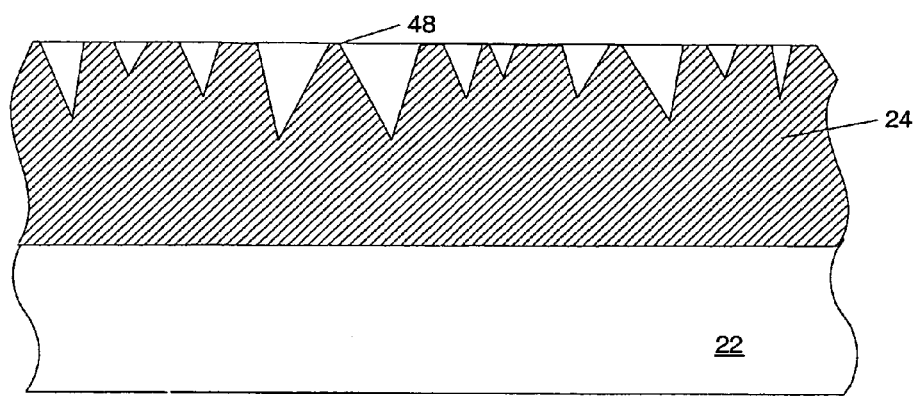
FIG. 8b depicts a partial cross-sectional view of the semiconductor topography, in an alternative embodiment, in which the fill layer of FIG. 7 is polished such that a surface comprising portions of the metal layer and portions of the fill layer residing above the metal layer is formed.
Figure 8C:
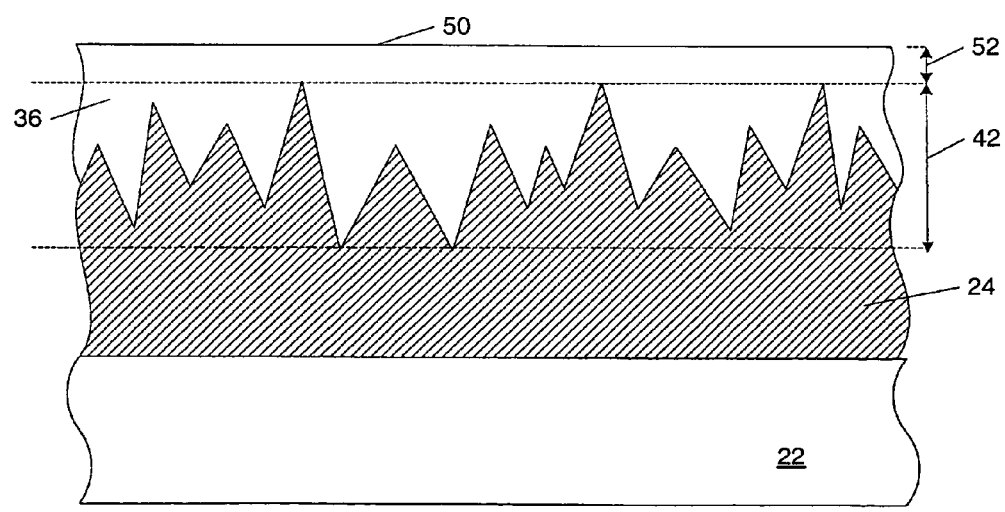
FIG. 8c depicts a partial cross-sectional view of the semiconductor topography, in yet another embodiment, in which the fill layer of FIG. 7 is polished to a level above the metal layer.
Figure 9:
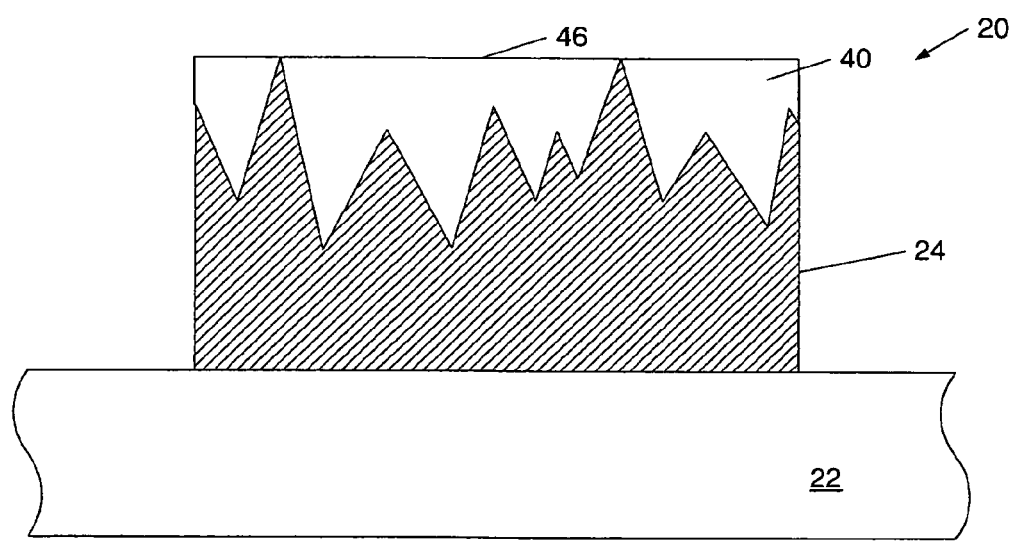

Another exemplary embodiment of the method described herein is illustrated in FIGS. 7-9. Such an embodiment may include depositing fill layer 40 upon metal layer 24 subsequent to FIG. 1 and prior to the polishing process described in FIG. 2. In particular, fill layer 40 may be deposited within the peaks and valleys associated with the surface roughness of metal layer 24. In some embodiments, fill layer 40 may be deposited such that an upper surface of fill layer 40 is above the peaks and valleys of metal layer 24 as shown in FIG. 7. As such, fill layer 40 may include a thickness greater than the largest valley to peak dimension. In some cases, fill layer 40 may include a thickness substantially greater than the mean surface roughness of metal layer 24. For example, fill layer 40 may include a thickness between approximately 1000 angstroms and approximately several thousand angstroms. Larger and smaller thicknesses of fill layer 40, however, may be appropriate in such an embodiment depending on the process parameters of the fabrication sequence.

Alternatively, fill layer 40 may be deposited such that an upper surface of fill layer 40 is below one or more of the peaks of metal layer 24 (not shown). In such an embodiment, one or more peaks of metal layer 24 may extend above fill layer 40. Consequently, fill layer 40 may include a thickness less than the largest valley to peak dimension. In some cases, fill layer 40 may include a thickness substantially less than the mean surface roughness of metal layer 24. As such, fill layer 40, in some cases may include a thickness less than approximately 80 angstroms. More specifically, fill layer 40 may include a thickness between approximately 15 angstroms and approximately 40 angstroms. However, larger or smaller thickness of fill layer 40 may be used in such an embodiment depending on the process parameters of the fabrication sequence.

In either embodiment, fill layer 40 may include any material adapted to surround and fill the peaks and valleys of metal layer 24. For example, fill layer 40 may include a metal such as aluminum, copper, tantalum, titanium, tungsten, or a metal alloy thereof. In such an embodiment, fill layer 40 may include a different material than is included in metal layer 24. In other embodiments, fill layer 40 may include the same material as metal layer 24. In either embodiment, the upper surface of metal layer 24, in such an embodiment, may be conductive subsequent to the polishing process described below. In this manner, the upper surface of metal layer 24 may be adapted for electrical connection with another conductive structure.

In other embodiments, fill layer 40 may include a dielectric material such as, silicon dioxide ($SiO_2$), silicon nitride ($Si_xN_y$), silicon oxynitride, or tetraethylorthosilicate glass (TEOS) based silicon dioxide, borophosphosilicate glass (BPSG), phosphosilicate glass (PSG), and fluorinated silicate glass (FSG), for example. In such an embodiment, the upper surface of metal layer 24 subsequent to the polishing process described below may have substantially high resistance or may not be conductive. In this manner, the polished upper surface of metal layer 24, in such an embodiment, may be unsuitable for electrical connection with another conductive structure. In such a case, other surfaces of metal layer 24 may be adapted for electrical connection with another conductive structure. For example, the lower surface of metal layer 24 or one or more sidewalls of metal layer 24 may be adapted for electrical connection with another conductive structure. In further embodiments, other materials known in the semiconductor industry may also or alternatively be used. For example, fill layer 40 may include a metal nitride or metal oxide, such as titanium nitride, tungsten nitride, tungsten oxide, or aluminum oxide.

As shown in FIGS. 8a-8c, fill layer 40 may be polished to different levels with respect to metal layer 24. In particular, fill layer 40 may be polished to different levels with respect to interface 42 of metal layer 24 and fill layer 40. Such an interface may be bound by an upper boundary and a lower boundary and include laterally adjacent portions of metal layer 24 and fill layer 40. In general, the upper boundary may be denoted by the upper most portion of metal layer 24, such as the crest of peak 32, and laterally adjacent portions of fill layer 40. The lower boundary of interface 42 may be denoted by the lower most portion of fill layer 40 (e.g., the portion of fill layer residing in the base of valley 44) and laterally adjacent portions of metal layer 24. Consequently, interface 42 may include a thickness that is approximately equal to the largest valley to peak dimension. As such, interface 42 may have a thickness that is greater than approximately 70 angstroms. In some cases, interface 42 may have a thickness between approximately 100 angstroms and approximately 300 angstroms. Larger and smaller thicknesses of interface 42, however, may be appropriate depending on the surface roughness of metal layer 24.

FIG. 8a illustrates semiconductor topography 20 subsequent to polishing fill layer 40 such that an upper surface of fill layer 40 is substantially level with at least one of the peaks associated with the surface roughness of metal layer 24. In particular, FIG. 8a illustrates substantially smooth surface 46 level with upper most peak 32 and two other peaks at approximately the same elevation. In this manner, the upper surface of fill layer 40 may be substantially level with the upper boundary of interface 42 of metal layer 40 and fill layer 40 as defined above. In another embodiment, fill layer 40 may be polished down to a level below the crests of the upper most peaks. In this manner, the upper surface of fill layer 40 may be above, below, or level with one or more peaks arranged below the uppermost peaks. In yet another embodiment, fill layer 40 may be polished down to a level below all of the peaks' crests as shown in FIG. 8b. In either embodiment, semiconductor topography 20 may include substantially smooth surface, such as surface 48 which includes portions of metal layer 24 and portions of fill layer 40. Consequently, such a surface may be included at any level within interface 42.

In general, the method described for FIGS. 7-8b may be distinct from a conventional method of polishing an overlying layer to expose a metal surface, such as polishing a dielectric layer overlying a gate electrode to expose the upper surface of the gate electrode. Such a conventional process typically involves forming a conductive contact area which is adapted for electrical connection to another conductive structure. The method described for FIGS. 7-8b specifically teaches polishing semiconductor topography 20 such that portions of metal layer 24 may be exposed and portions of fill layer 40 remain above other portions of metal layer 24. The conventional method of polishing an overlaying layer to expose a metal surface, however, does not include leaving portions of the overlying layer above the metal surface. In fact, such a method purposely "over etches" (i.e., extends the polishing process time) to insure that no portions of the overlying layer remain above the metal surface. In this manner, the metal surface may be insured to be adapted for electrical connection with another conductive structure. As stated above, however, the upper surface of metal layer 24 in some embodiments described above for FIGS. 7-8c may not be adapted for electrical connection with another conductive structure since portions of fill layer 40 residing above metal layer 24 after the polishing process may increase the resistance of the contact area or render the contact area non-conductive.

In an alternative embodiment, fill layer 40 may be polished to a level substantially above all peaks of metal layer 24 as shown in FIG. 8c. In such an embodiment, substantially smooth surface 50 may be formed above the upper boundary of interface 42. In particular, polishing fill layer 40 may form substantially smooth surface 50 above the upper boundary of interface 42 by a thickness less than the thickness of interface 42 as shown in FIG. 8c. As such, thickness 52 of fill layer 40 residing above the upper boundary of interface 42 may be less than the largest surface roughness measurement of metal layer 24. In this manner, the method described for such an embodiment may be distinct from the conventional method of polishing an interlevel dielectric formed above a metal layer. Such a conventional method does not typically reduce the thickness of an interlevel dielectric to such a small thickness. In particular, interlevel dielectrics are generally kept at a thickness of a few thousand angstroms above a metal layer to provide an adequate amount of insulation. On the contrary, thickness 52 of fill layer 40 of the method described for FIG. 8c may be less than the mean surface roughness measurement of metal layer 24. More specifically, thickness 52 may be less than approximately 80 angstroms in some embodiments. In some cases, the thickness of fill layer 40 residing above the upper boundary of interface 42 may be between approximately 15 angstroms and approximately 40 angstroms. Larger or smaller thicknesses of fill layer 40 residing above the upper boundary of interface 42, however, may be used in such an embodiment depending on the process parameters of the fabrication sequence.

In some cases, the polished surface may be measured after fill layer 40 is polished down to a level, such as those illustrated in FIGS. 8a-8c. In such an embodiment, the method may further include re-polishing semiconductor topography 20 when the measured mean surface roughness is above a predetermined value. For example, in some cases, the predetermined value may be a mean surface roughness greater than approximately ten angstroms. However, larger and smaller mean surface roughness values may be used for the predetermined value depending on the design specifications of the device. In other embodiments, the polished surface may be re-polished without measuring the mean surface roughness. In this manner, a polished surface of semiconductor topography 20 may be formed at a lower level than formed during the first polishing process. For example, semiconductor topography 20 may be first polished down to a level within interface 42 such as that illustrated in FIG. 8a and surface 46 may be re-polished to form surface 48 of FIG. 8b. In another embodiment, semiconductor topography 20 may be polished down to a level illustrated in FIG. 8c and further polished down to a level illustrated in either FIG. 8a or 8b, depending on the mean surface roughness measurement of surface 50. In general, semiconductor topography 20 may be polished down to any level within interface 42, depending on the design specifications of the device. In any embodiment, a lower mean surface roughness may be obtained by such a re-polishing step.

The polishing processes of FIGS. 8a-8c may be similar to that of the polishing process described for FIGS. 2 and 6. In this manner, the polishing process may include pressing semiconductor topography 20 toward a polishing pad using similar polishing pad mediums and slurries as described for FIG. 2. In addition, such a polishing process may include removing an upper portion of fill layer 40. In some embodiments, the polishing process may further include removing an upper portion of metal layer 24. In such an embodiment, however, the polishing process may include removing less of metal layer 24 than in an embodiment in which metal layer 24 is polished without having fill layer 40 thereupon, such as described in FIGS. 2 and 6 above. For example, the polishing process of FIGS. 8a-8c may include removing less than approximately 100 angstroms of metal layer 24. Larger or smaller amounts of metal layer 24, however, may be removed depending on the process parameters of the polishing process and the design specifications of the device. Minimizing the amount removed from metal layer 24 may be advantageous in some applications. For example, in an embodiment in which metal layer 24 is subsequently formed into a digit line of a MRAM device, the distance between the digit line and a subsequently formed MTJ may be more closely controlled. In this manner, less current may be needed to control the magnetic fields used to switch the states of the memory cell.

Moreover, the polishing process, in some embodiments, may include producing a mean surface roughness less than the mean surface roughness obtained during the deposition of metal layer 24. For example, in some embodiments, the polishing may include producing a mean surface roughness of less than approximately 80 angstroms. In other embodiments, the polishing process may include producing a mean surface roughness of less than approximately 10 angstroms or less than approximately 2 angstroms. In yet other embodiments, the polishing process may include producing a mean surface roughness between approximately 2 angstroms and approximately 4 angstroms. As such, the polishing process may reduce the mean surface roughness of metal layer 24 by a factor of at least approximately ten. More particularly, polishing metal layer 24 may include reducing the mean surface roughness of the layer by a factor between approximately ten and one hundred. In yet other embodiments, the polishing process may reduce the mean surface roughness of the metal layer by a factor of approximately fifty. As stated above, such mean surface roughness values may be obtained using any statistical mean calculation, such as average or root mean square. In addition, although FIGS. 8a-8c show substantially smooth surfaces 46, 48, and 50 absent of any peaks or valleys, smooth surfaces 46, 48, and 50 may include peaks and valleys, in some embodiments. However, the peaks and valleys of smooth surfaces 46, 48, and 50, in such an embodiment, may be small enough to produce mean surface roughness values as referenced above.

In some cases, fill layer 40 may include a material with different polish characteristics than metal layer 24 such that exposure of an interface between metal layer 24 and fill layer 40 may be detected by monitoring the polishing system. One method of indicating exposure to such an interface is to monitor the current drawn by the motor, which is used to rotate the polishing pad and/or the wafer. In general, the current required by the polishing motor is directly proportional to the friction generated by the polishing process. Therefore, when the friction between a polishing pad and a semiconductor topography changes, a corresponding change in the current required by the polishing motor will occur. This change in current may be detected by an end-point detection system associated with the polishing system and thereby indicate when a different material of the semiconductor topography is in contact with the polishing pad. Such a monitoring system may be used in embodiments that include exposing portions of metal layer 24 as described in FIGS. 8a and 8b. In other embodiments, the thickness of fill 40 and the polishing process time may be optimized to achieve a substantially smooth surface at a specific level within semiconductor topography 20. Alternatively, other methods known in the semiconductor fabrication industry may also be used for achieving a surface at such a specified level.

In some embodiments, the method described herein may include patterning semiconductor topography 20 subsequent to polishing fill layer 40. For example, semiconductor topography 20 depicted in FIG. 8a may be patterned to form a metal structure as shown in FIG. 9. Such a patterning process may be similar to that of the patterning processes described for FIGS. 4 and 5. In particular, the patterning process may include forming a resist layer upon surface 46, 48, or 50, patterning the resist to form a mask for the subsequently formed structure, and removing exposed portions of fill layer 40 and metal layer 24. Subsequently, the resist layer may be removed by a stripping process such as a wet etch or a reactive ion etch stripping process. In some cases, an additional layer may be deposited upon surface 46, 48, or 50 prior to such a patterning process. Such an additional layer may be similar to that of upper layer 38 described in FIG. 3 above. Alternatively, such an additional layer may be omitted from semiconductor topography 20 during the polishing process.

Figure 10:
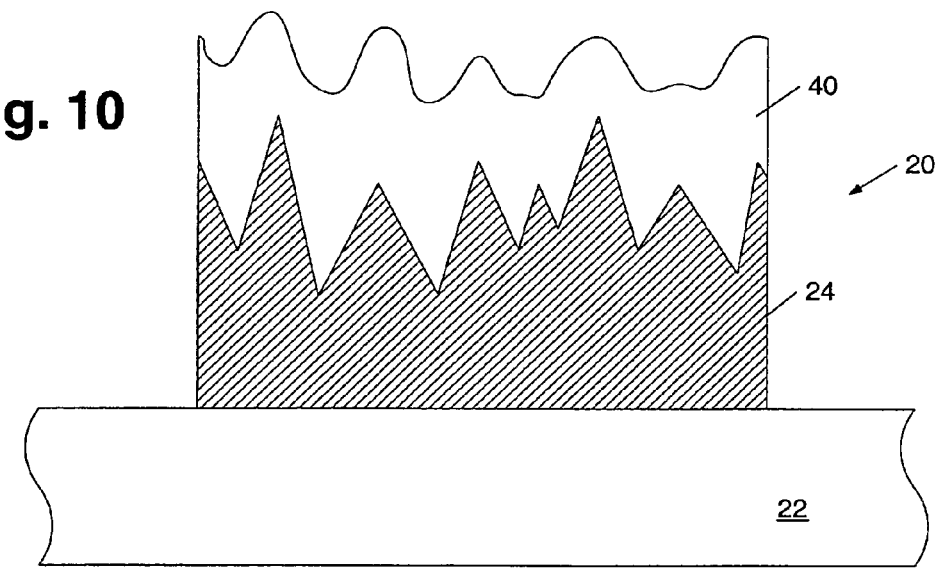
FIG. 10 depicts a partial cross-sectional view of the semiconductor topography, in an alternative embodiment, in which the fill layer and metal layer are patterned subsequent to the deposition of the fill layer in FIG. 7.

In an alternative embodiment, the sequence of the polishing and patterning processes described above may be changed such that semiconductor topography 20 is patterned prior to the polishing process. In this manner, semiconductor topography 20 may be substantially absent of any material laterally adjacent to metal layer 24 during a subsequent polishing process. FIG. 10 illustrates metal layer 24 patterned subsequent to the deposition of fill layer 40 in FIG. 7 and prior to the polishing processes described in FIGS. 8a-8c. Alternatively, semiconductor topography 20 may be patterned prior to the deposition of fill layer 40. In such an embodiment, semiconductor topography may look similar to FIG. 5. Subsequently, fill layer 40 may be deposited upon the patterned metal layer. In such an embodiment, fill layer 40 may be further deposited upon adjacent portions of semiconductor layer 22. In either embodiment, the patterning process may be similar to the patterning process described in FIGS. 4, 5, and 9 above. As such, the patterning process may include forming a resist layer upon fill layer 40, patterning the resist layer to form a mask for the subsequently formed structure, removing exposed portions of fill layer 40 and metal layer 24, and removing remaining portions of the resist layer. Although the removal of the resist layer during such a patterning process may, in some embodiments, increase or decrease the surface roughness of fill layer 40, such a patterning process may not render a substantially smooth surface (i.e., a surface having a mean surface roughness of less than approximately 80 angstroms).

Figure 11:
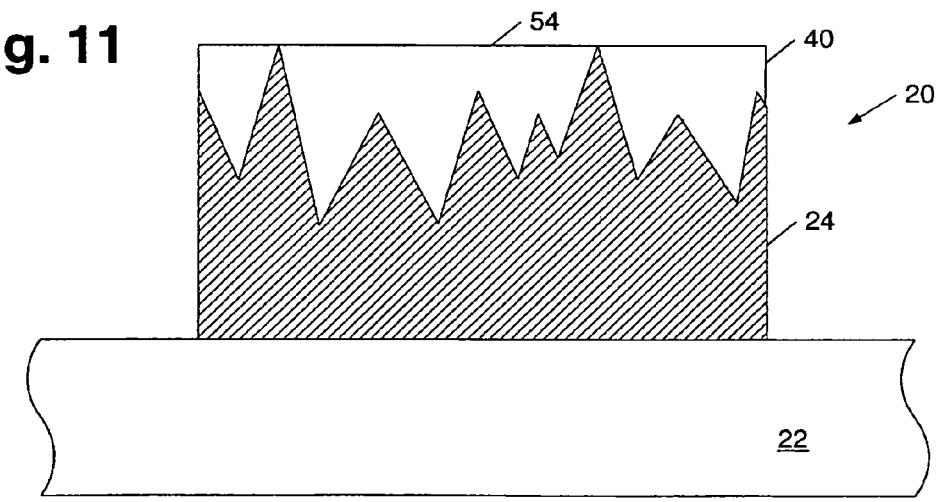
FIG. 11 depicts a partial cross-sectional view of the semiconductor topography subsequent to polishing the fill layer of FIG. 10.

Therefore, semiconductor topography 20 may be subsequently polished to form substantially smooth surface 54 as shown in FIG. 11. Such a polishing process may be similar to that of the polishing process described for FIGS. 8a-8c. In this manner, the polishing process may include pressing semiconductor topography 20 toward a polishing pad such that an upper portion of fill layer 40 may be removed. As shown in FIG. 11, such a polishing process may be terminated at a level at which an upper surface of fill layer 40 is substantially level with at least one of the peaks associated with the surface roughness of metal layer 24. In some cases, such a polishing process may include removing an upper portion of metal layer 24, as well. In such an embodiment, the polished surface may include portions of metal layer 24 and portions of fill layer 40 residing above metal layer 24. More specifically, the polished surface may include portions of metal layer 24 and laterally adjacent portions of fill layer 40 residing above other portions of metal layer 24. In yet another embodiment, the polishing process may terminate at a level above metal layer 24. In such an embodiment, the thickness of fill layer 40 residing above the interface 42 is preferably less than the thickness of the interface. In either case, the polishing process may include producing a mean surface roughness less than the mean surface roughness obtained during the deposition of the metal layer. Such a reduction in mean surface roughness may be quantified by similar factors or roughness ranges as described in FIGS. 8a-8c above.

Although FIG. 11 shows substantially smooth surface 54 absent of any peaks or valleys, in some embodiments, smooth surface 54 may include peaks and valleys. However, the peaks and valleys of smooth surface 54, in such an embodiment, may be small enough to produce mean surface roughness values as referenced above. In addition, as included in the method of FIGS. 1-4, a mean surface roughness of surface 54 may be determined subsequent to polishing the metal layer. In some cases, the method may further include re-polishing surface 54 when the measured mean surface roughness is above a predetermined value. For example, in some cases, the predetermined value may be a mean surface roughness greater than approximately ten angstroms. Larger and smaller mean surface roughness values may be used for the predetermined value, however, depending on the design specifications of the device. In other embodiments, the surface may be re-polished without measuring the mean surface roughness of the layer. In either embodiment, such a re-polishing step may allow a lower mean surface roughness to be obtained. More specifically, such a re-polishing step may produce a lower mean surface roughness than obtained during the first polishing step.

It will be appreciated to those skilled in the art having the benefit of this disclosure that this invention is believed to provide a method for obtaining a substantially smooth surface on a metal structure. Further modifications and alternative embodiments of various aspects of the invention will be apparent to those skilled in the art in view of this description. For example, the method described herein may include further processing steps, including additional layers or structures formed above or below the substantially smooth surface described herein. In this manner, a semiconductor structure including a substantially smooth surface may be fabricated. It is intended that the following claims be interpreted to embrace all such modifications and changes and, accordingly, the drawings and the specification are to be regarded in an illustrative rather than a restrictive sense.

What is claimed is:

1. A magnetic random access memory device comprising a digit line with a mean surface roughness of less than approximately 10 angstroms, wherein the digit line comprises tungsten nitride.

2. The magnetic random access memory device of claim 1, wherein said mean surface roughness is less than approximately 3.0 angstroms.

3. The magnetic random access memory device of claim 1, wherein the digit line comprises a thickness between approximately 1000 angstroms and approximately 3000 angstroms.

4. The magnetic random access memory device of claim 1, wherein said mean surface roughness is less than approximately 2.0 angstroms.

5. A magnetic random access memory device comprising a metal layer with a mean surface roughness of less than approximately 10 angstroms, wherein the metal layer comprises titanium nitride.

6. The magnetic random access memory device of claim 1, wherein said mean surface roughness is less than approximately 3.0 angstroms.

7. The magnetic random access memory device of claim 1, wherein said metal layer comprises a digit line of the magnetic random access memory device.

8. The magnetic random access memory device of claim 5, wherein said metal layer is a layer within a magnetic tunneling junction of the magnetic random access memory device.

9. The magnetic random access memory device of claim 5, wherein said metal layer is arranged within a gate structure of the magnetic random access memory device.

10. The magnetic random access memory device of claim 5, wherein said metal layer is arranged within an interconnect line of the magnetic random access memory device.

11. The magnetic random access memory device of claim 5, wherein the metal layer comprises a thickness between approximately 300 angstroms and approximately 3000 angstroms.

12. The magnetic random access memory device of claim 5, wherein said mean surface roughness is less than approximately 2.0 angstroms.

13. The magnetic random access memory device of claim 5, wherein the metal layer is arranged underneath a tunneling layer of a magnetic tunneling junction within the magnetic random access memory device.

14. A semiconductor topography comprising a metal nitride layer with a thickness between approximately 300 angstroms and approximately 3000 angstroms and a mean surface roughness of less than approximately 10 angstroms, wherein said metal nitride layer is arranged within a gate structure of the semiconductor topography.

15. The semiconductor topography of claim 14, wherein said mean surface roughness is less than approximately 3.0 angstroms.

16. The semiconductor topography of claim 14, wherein the metal nitride layer comprises tungsten nitride.

17. The semiconductor topography of claim 14, wherein the metal nitride layer comprises titanium nitride.

18. The semiconductor topography of claim 14, wherein said mean surface roughness is less than approximately 2.0 angstroms.

* * * * *

UNITED STATES PATENT AND TRADEMARK OFFICE
CERTIFICATE OF CORRECTION

PATENT NO.       : 7,329,934 B1
APPLICATION NO.  : 10/850247
DATED            : February 12, 2008
INVENTOR(S)      : Koutny, Jr.

Page 1 of 1

It is certified that error appears in the above-identified patent and that said Letters Patent is hereby corrected as shown below:

Col. 19, line 44: In claim 6, please delete "claim 1" and substitute --claim 5--.

Col. 20, line 2: In claim 7, please delete "claim 1" and substitute --claim 5--.

Signed and Sealed this

Twenty-eighth Day of April, 2009

JOHN DOLL
*Acting Director of the United States Patent and Trademark Office*